United States Patent
Uozumi et al.

(10) Patent No.: US 7,776,754 B2
(45) Date of Patent: Aug. 17, 2010

(54) SEMICONDUCTOR DEVICE MANUFACTURING METHOD AND CHEMICAL FLUID USED FOR MANUFACTURING SEMICONDUCTOR DEVICE

(75) Inventors: Yoshihiro Uozumi, Yokohama (JP); Kazuhiko Takase, Yokohama (JP); Tsuyoshi Matsumura, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 753 days.

(21) Appl. No.: 11/545,515

(22) Filed: Oct. 11, 2006

(65) Prior Publication Data
US 2007/0082491 A1   Apr. 12, 2007

(30) Foreign Application Priority Data
Oct. 11, 2005   (JP)   .............................. 2005-296724

(51) Int. Cl.
*H01L 21/302* (2006.01)
*H01L 21/461* (2006.01)

(52) U.S. Cl. ................................ 438/745; 257/E21.228

(58) Field of Classification Search ................ 438/710, 438/692–696, 704, 637, 639, 675, 4, 700, 438/745; 257/E21.214, E21.219, E21.577, 257/E21.224, E21.579, E21.228, E21.241
See application file for complete search history.

(56) References Cited

U.S. PATENT DOCUMENTS

| 6,457,477 | B1 * | 10/2002 | Young et al. .................. 134/1.2 |
| 7,122,481 | B2 * | 10/2006 | Kloster et al. ................ 438/725 |
| 7,309,658 | B2 * | 12/2007 | Lazovsky et al. ............ 438/754 |
| 7,405,168 | B2 * |  7/2008 | Lee et al. ..................... 438/781 |
| 7,541,200 | B1 * |  6/2009 | van Schravendijk et al. ... 438/4 |

| 2004/0009658 | A1 * | 1/2004 | Aoki et al. ................... 438/629 |
| 2004/0106531 | A1 * | 6/2004 | Kanno et al. ................. 510/175 |
| 2004/0152296 | A1 * | 8/2004 | Matz et al. ................... 438/623 |
| 2005/0077597 | A1 * | 4/2005 | Toma et al. ................... 257/629 |
| 2005/0095840 | A1 * | 5/2005 | Bhanap et al. ............... 438/623 |
| 2005/0158884 | A1 * | 7/2005 | Gaynor .......................... 438/4 |
| 2006/0042651 | A1 * | 3/2006 | Verhaverbeke et al. ......... 134/1 |
| 2006/0057837 | A1   | 3/2006 | Bhanap et al. |
| 2006/0057855 | A1 * | 3/2006 | Ramos et al. ................ 438/710 |

(Continued)

FOREIGN PATENT DOCUMENTS

JP   2001-110899   4/2001

(Continued)

OTHER PUBLICATIONS

Notification of Opinions of the Examination issued Feb. 3, 2010, from the Taiwanese Patent Office in corresponding Taiwan Application No. 095137382, and English translation thereof.

*Primary Examiner*—W. David Coleman
*Assistant Examiner*—Latanya Crawford
(74) *Attorney, Agent, or Firm*—Finnegan, Henderson, Farabow, Garrett & Dunner, L.L.P.

(57) ABSTRACT

This disclosure is concerned a method of manufacturing a semiconductor device which includes providing an dielectric film on a substrate; providing a mask material on the dielectric film; etching the dielectric film using the mask material; performing a first treatment of removing a metal residue generated by etching the dielectric film; performing a second treatment of making a sidewall of the dielectric film formed by etching the dielectric film hydrophobic; and performing a third treatment of removing a silicon residue generated by etching the dielectric film.

6 Claims, 4 Drawing Sheets

U.S. PATENT DOCUMENTS

| | | | |
|---|---|---|---|
| 2006/0108320 A1* | 5/2006 | Lazovsky et al. | 216/2 |
| 2007/0077781 A1* | 4/2007 | Lee et al. | 438/781 |
| 2008/0057728 A1* | 3/2008 | Shimura et al. | 438/735 |
| 2008/0207005 A1* | 8/2008 | Farkas | 438/745 |
| 2008/0254625 A1* | 10/2008 | Sharma | 438/689 |
| 2008/0311752 A1* | 12/2008 | Sharma | 438/694 |
| 2009/0301867 A1* | 12/2009 | Farkas et al. | 204/242 |

FOREIGN PATENT DOCUMENTS

| | | |
|---|---|---|
| WO | WO 2005/034194 A2 | 4/2005 |

\* cited by examiner

SEMICONDUCTOR DEVICE MANUFACTURING METHOD AND CHEMICAL FLUID USED FOR MANUFACTURING SEMICONDUCTOR DEVICE

CROSS-REFERENCE TO RELATED APPLICATION

This application is based upon and claims the benefit of priority from the prior Japanese Patent Application No. 2005-296724, filed on Oct. 11, 2005, the entire contents of which are incorporated herein by reference.

BACKGROUND OF THE INVENTION

1. Field of the Invention

The present invention relates to a semiconductor device manufacturing method and a chemical fluid used for manufacturing a semiconductor device.

2. Background Art

In a method of manufacturing a semiconductor device, when an interlayer dielectric film provided on a wiring is etched to form a via in the interlayer dielectric film, a sidewall of the interlayer dielectric film is sometimes damaged. Since the damaged sidewall of the interlayer dielectric film is susceptible to etching, the damaged sidewall is sometimes etched together with etching by-products when the etching by-products are removed by a chemical fluid. If the sidewall of the interlayer dielectric film is excessively etched, a diameter of the via hole is disadvantageously, excessively made large.

Furthermore, the damaged sidewall of the interlayer dielectric film tends to absorb moisture, and the absorbed moisture sometimes adversely influences electric characteristics of a completed semiconductor device. A low-dielectric-constant material (hereinafter, "low-k film") such as MSQ (methyl silses quioxane) used as a material of the interlayer dielectric film is particularly prone to damage and a damaged part of the MSQ shows a high moisture absorption characteristics.

SUMMARY OF THE INVENTION

A method of manufacturing a semiconductor device according to an embodiment of the present invention comprises providing an dielectric film on a substrate; providing a mask material on the dielectric film; etching the dielectric film using the mask material; performing a first treatment of removing a metal residue generated by etching the dielectric film; performing a second treatment of making a sidewall of the dielectric film formed by etching the dielectric film hydrophobic; and performing a third treatment of removing a silicon residue generated by etching the dielectric film.

A method of manufacturing a semiconductor device according to an embodiment of the present invention comprises providing an dielectric film on a substrate; providing a mask material on the dielectric film; etching the dielectric film using the mask material as a mask; removing a metal residue generated by etching the dielectric film; and making a sidewall of the dielectric film formed by etching the dielectric film hydrophobic, and simultaneously removing a silicon residue generated by etching the dielectric film.

A method of manufacturing a semiconductor device according to an embodiment of the present invention comprises providing an dielectric film on a substrate; providing a mask material on the dielectric film; etching the dielectric film using the mask material; and removing a metal residue generated by etching the insulating material, simultaneously making a sidewall of the dielectric film formed by etching the dielectric film hydrophobic, and simultaneously removing a silicon residue generated by etching the dielectric film.

A chemical fluid used to manufacture a semiconductor device according to an embodiment of the present invention, wherein the chemical fluid contains at least a silylation reagent for making an etching-target material hydrophobic and a fluorine compound dissolving a silicon residue generated by etching the etching-target material.

DETAILED DESCRIPTION OF THE INVENTION

Hereafter, embodiments of the present invention will be described with reference to the drawings. Note that the invention is not limited to the embodiments.

First Embodiment

Figure 1:
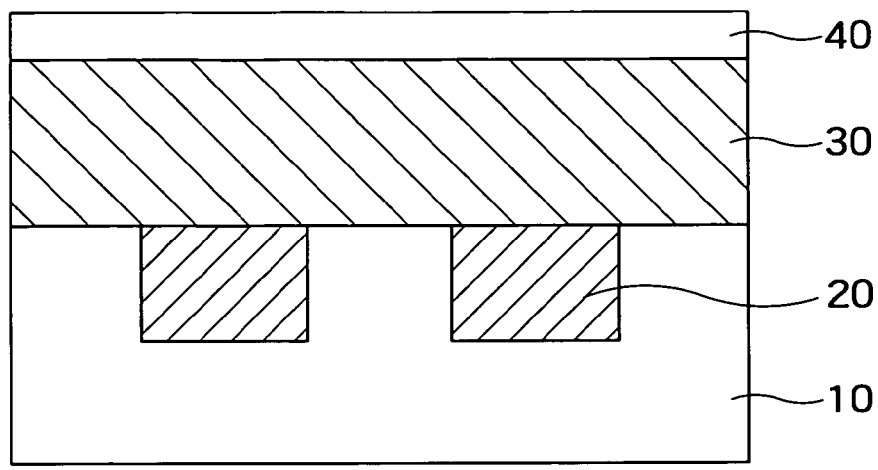
FIG. 1 is a cross section showing a method of manufacturing a semiconductor device according to a first embodiment of the present invention.
Figure 2:
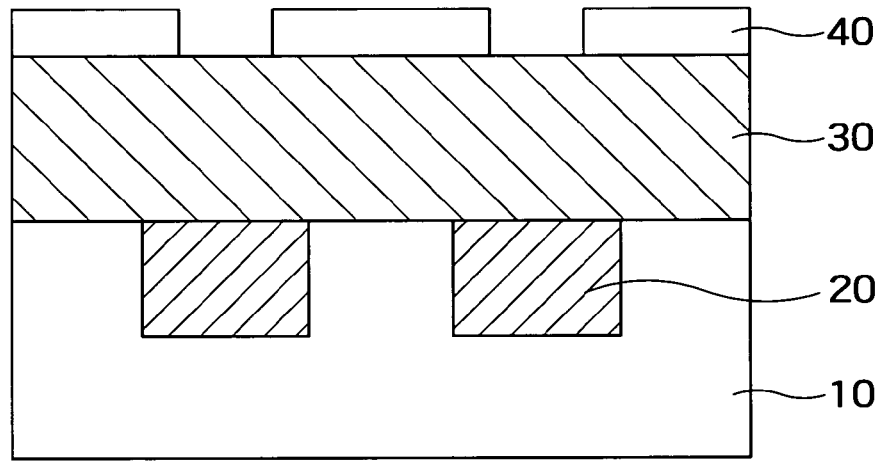
FIG. 2 is a cross section showing a method of manufacturing a semiconductor device following FIG. 1.
Figure 3:
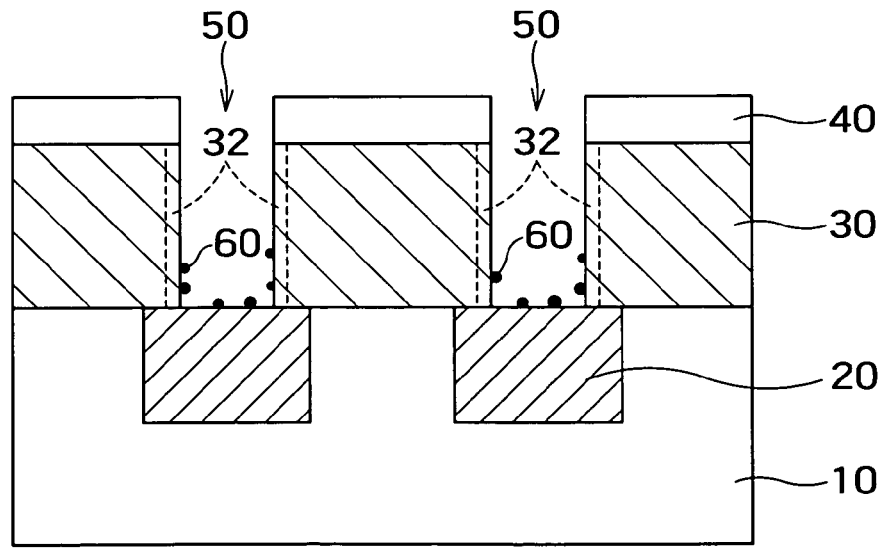
FIG. 3 is a cross section showing a method of manufacturing a semiconductor device following FIG. 2.

FIGS. 1 to 3 are cross sections showing a method of manufacturing a semiconductor device according to a first embodiment of the present invention. In the first embodiment, a wiring 20 embedded into an insulating material 10 by damascene is used as a front-end material. The wiring 20 is made of, for example, copper, tungsten, or aluminum. It is preferable to form a barrier metal between the wiring 20 and the insulating material 10. The barrier metal is, for example, titanium, tantalum, titanium nitride, or tantalum nitride. In the first embodiment, it is assumed that the wiring 20 mainly consists of copper. Generally, a semiconductor substrate (not shown) and a semiconductor element (not shown) formed on the semiconductor substrate are formed below the insulating material 10. At least a part of the wiring 20 is formed to be electrically connected to an electrode of the semiconductor element or the like.

First, as shown in FIG. 1, an interlayer dielectric film 30 is deposited on the insulating material 10 and the wiring 20. The interlayer dielectric film 30 is a low-k film, which is made of a matter obtained by imparting an organic functional group such as a methyl ($CH_3$) group to an Si—O bond like MSQ. The interlayer dielectric film 30 can be a single-layer film or a laminated film that is obtained by depositing a combination of a plurality of films. At least one film in the laminated film is made of the matter obtained by imparting an organic functional group to an Si—O bond. When the laminated film is to be deposited, a stopper film can be provided under the laminated film. The stopper film is preferably, for example, an SiC film or an SiCN film.

A mask material 40 is then formed on the interlayer dielectric film 30. The mask material 40 can be either a photoresist or a hard mask. Preferably, the mask material 40 is a hard mask made of a silicon nitride film or the like. The hard mask can be obtained by laminating a plurality of materials to be used.

As shown in FIG. 2, the mask material 40 is patterned by lithography and RIE (reactive ion etching).

As shown in FIG. 3, using the mask material 40 as a mask, the interlayer dielectric film 30 is etched and a via hole 50 reaching the wiring 20 is formed. Etching by-products 60 are generated by etching the interlayer dielectric film 30. The etching by-products 60 are reaction products obtained by reaction between the material (copper) of the wiring 20 and etching gas. Examples of the etching by-products 60 include a copper oxide, a copper fluoride, and a copper carbonate (hereinafter, also "metal residue") such as $CuO$, $Cu_2O$, $CuF_2$, and $CuCO_3$, and a silicon compound (hereinafter, also "silicon residue") such as $SiO_x$. In etching, a sidewall of the interlayer dielectric film 30 is damaged, thereby forming a damaged layer 32. As explained, the damaged layer 32 is susceptible to etching and is high in moisture absorption characteristics.

To remove the etching by-products 60, a chemical fluid treatment is performed as a first treatment using a chemical fluid containing at least an inorganic acid, an organic acid, a salt of the inorganic acid or a salt of the organic acid. It is thereby possible to remove the etching by-products 60 while suppressing etching of the damaged layer 32. Examples of the inorganic acid include hydrochloric acid (HCl), dilute sulfuric acid, dilute sulfurous acid, hydrocyanic acid, carbonic acid, hydroxide carbonic acid, phosphoric acid, hydrobromic acid (HBr), hydriodic acid (HI), and hydrosulfuric acid. Examples of the organic acid include carboxylic acid such as citric acid, oxalic acid, acetic acid, maleic acid, fumaric acid, formic acid, benzoic acid, phthalic acid, terephthalic acid, salicylic acid, lactic acid, malic acid, tartaric acid, and propionic acid, sulfonic acid such as benzenesulfonic acid and toluenesulfonic acid, and amino acid such as glycine, alanine, serine, cystine, lysine, phenylalanine, tyrosine, and glutamic acid. Examples of the salt of the inorganic acid or the salt of the organic acid are an ammonium salt or an organic amine salt. When an oxidation-reduction potential of the chemical fluid is higher than 0.5 V, a probability of etching the front-end material (copper) is increased. It is, therefore, preferable that the oxidation-reduction potential of the chemical fluid is equal to or lower than 0.5 V.

After the first treatment, the semiconductor substrate is rinsed with deionized water. In rinsing, alcohol such as IPA (isopropyl alcohol), methanol, ethanol, or propanol can be used. Subsequently, further rinsing with purified water can be performed. After rinsing the semiconductor substrate with alcohol, the semiconductor substrate can be temporarily dried.

To make the damaged layer 32 hydrophobic, the semiconductor substrate is exposed to a chemical fluid containing a silylation reagent, as a second treatment. As a result of the second treatment, the damaged layer 32 is made hydrophobic.

To accelerate reaction, the first and the second treatments can be performed using the chemical fluids of which temperatures are raised.

Figure 4:
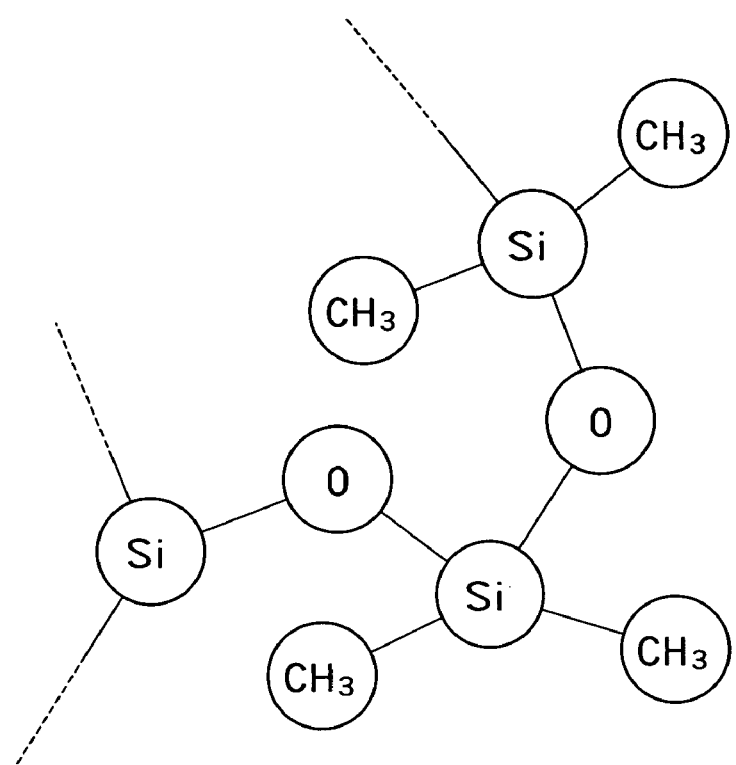
FIG. 4 shows a structure of a terminal part of an MSQ film.
Figure 5:
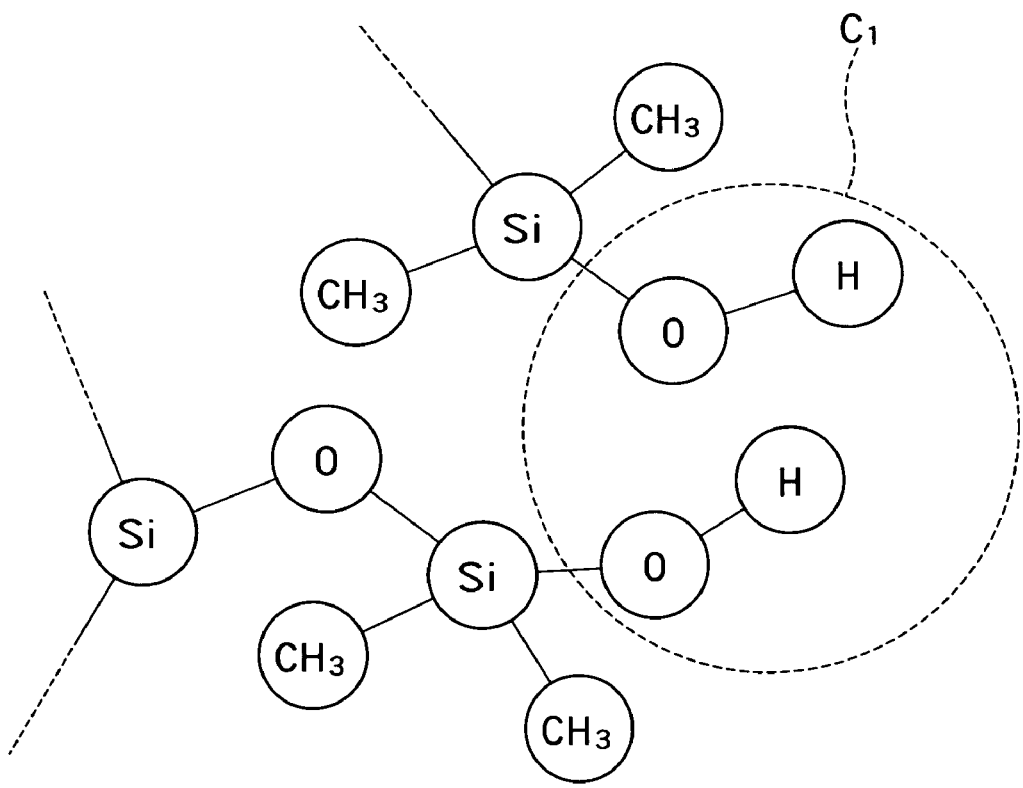
FIG. 5 shows a structure of an interlayer dielectric film 30 having a damage layer 32.
Figure 6:
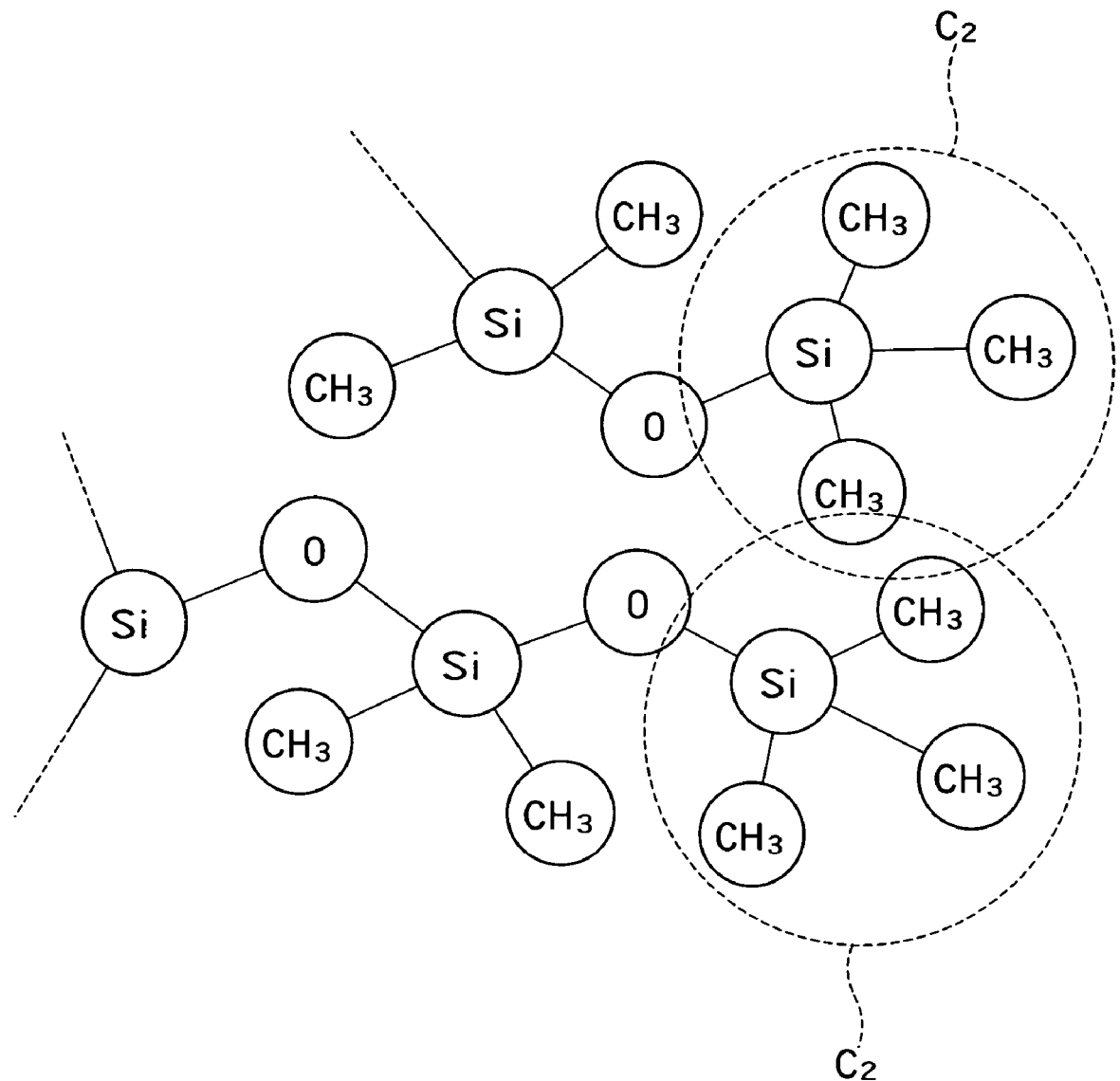
FIG. 6 shows a structure of an interlayer dielectric film 30 made hydrophobic.

FIGS. 4 to 6 show states in which the damaged layer 32 is formed on the interlayer dielectric film 30 made of MSQ, and in which the damaged layer 32 is made hydrophobic. FIG. 4 shows a structure of a terminal part of an MSQ film. The MSQ film is a film in which functional groups such as O and $CH_3$ groups are bonded to silicon atoms. When the interlayer dielectric film 30 is processed by the RIE or the like, the sidewall of the interlayer dielectric film 30 is hydrolyzed. Namely, as shown in FIG. 5, the hydrophobic $CH_3$ groups are dissociated from the MSQ film and hydrophilic OH groups (silanol groups: —Si—OH) are bonded to silicon atoms. As a result, the damaged layer 32 is formed. As indicated by a broken-line circle C1 shown in FIG. 5, the hydrophilic OH group is bonded to the terminal end of the damaged layer 32. If the OH groups contact with water present in the air, the OH groups and the water produce hydrogen bonds. Thus, the damaged layer 32 thereby absorbs moisture.

Meanwhile, after the second treatment, the damaged layer 32 is silylated (—Si—O—Si—R) and made hydrophobic. Silylation is a treatment of reacting the silylation reagent with silanol OH groups, and the OH groups are substituted for by hydrophobic groups. In the first embodiment, methyl groups ($CH_3$ groups) are used as the hydrophobic groups. As a result of the silylation, the sidewall of the interlayer dielectric film 30 is terminated with the $CH_3$ groups as indicated by broken-line circles C2 shown in FIG. 6. As a consequence, the damaged layer 32 is reformed and the sidewall of the interlayer dielectric film 30 becomes hydrophobic.

The hydrophobic group is not limited to the methyl group. Alternatively, the hydrophobic group can be replaced by various other functional groups according to the type of the silylation reagent. Examples of the silylation reagent include chlorosilane (including dichlorosilane and trichlorosilane), alkoxylane, cyclosiloxane, polysiloxane, silylamine, silylamide, hexamethyldisilazane (HMDS), trimethylchlorosilane, and octylchlorosilane.

If the silylation reagent contains halogen (Cl, F, Br, I, or the like), a sulfone group ($SO_3H$), a nitro group ($NO_x$), or the like as the functional group, the silylation reagent may possibly corrode the wiring 20. Therefore, if a metal is used for the wiring 20, it is preferable to use a silylation reagent that does not contain halogen, a sulfone group, or a nitro group.

Preferably, the semiconductor substrate is subjected to a heat treatment after the second treatment to further accelerate the silylation of the damaged layer 32. To suppress oxidation of the front-end material, the heat treatment is performed in an atmosphere in which oxidative matters are almost eliminated.

Furthermore, to remove a silicon residue such as SiOx, as a third treatment, the semiconductor substrate is soused to a chemical fluid which is a mixture of fluorine compounds such as HF and $NH_4F$, a fluorine compound of an organic amine, and a fluorine compound of an organic amide. If the front-end material is a silicon-containing material (e.g., a silicon nitride film or a silicon carbonitride film), the silicon residue is generated. The silicon residue is one of the etching by-products. At the time of the third treatment, since the sidewall of the interlayer dielectric film 30 is already silylated, the etching of the sidewall of the interlayer dielectric film 30 is suppressed. The third treatment can, therefore, effectively remove the silicon residue. The third treatment can be performed either before or after the first treatment using the inorganic acid or the organic acid.

The etching of the sidewall of the interlayer dielectric film 30 is suppressed due to the silylation of the sidewall. However, it is preferable to control a pH of the chemical fluid used in the third treatment by controlling an amount of water and an amount of the fluorine compound such as fluorinated acid so as to suppress the damaged layer 32 from being etched. More specifically, it is preferable to make the chemical fluid a weak acid or alkaline fluid having a pH equal to or higher than 4 by controlling dissociation to $F^-$ ions and generation of $HF_2^-$ ions. By using the chemical fluid thus controlled, it is possible to suppress the etching of $SiO_2$ to prevent excessive etching of the damaged layer 32 in the third treatment.

The first and the second treatments according to the first embodiment are preformed by exposing the semiconductor substrate to the respective chemical fluids. However, the first and the second treatments can be performed by subjecting the semiconductor substrate to a heat treatment in an atmosphere containing a desired chemical fluid. For example, the second treatment can be a heat treatment performed in an atmosphere of silylation-reagent-containing vapor.

In the first embodiment, the first treatment can be performed either before or after the second treatment. If the second treatment is performed after the first treatment, the damaged layer 32 is made hydrophobic after removing the etching by-products. Therefore, it is possible to ensure making the entire damaged layer 32 hydrophobic without being obstructed by the etching by-products. If the first treatment is performed after the second treatment, the etching by-products are removed after making the damaged layer 32 hydrophobic. It is, therefore, possible to further suppress etching of the damaged layer 32 in the first treatment.

In the first embodiment, the first and the second treatments can be performed non-sequentially. However, the first and the second treatments are preferably performed sequentially in the same apparatus. It is more preferable to perform the first and the second treatments sequentially in the same apparatus in an atmosphere in which oxidative matters and moisture are almost eliminated. If the first and the second treatments are performed non-sequentially, the damaged layer 32 may possibly absorb moisture during waiting for the next treatment even with the etching by-products 60 removed in the first treatment. The absorbed moisture may adversely influences the electric characteristics of a completed semiconductor device. It is, therefore, unpreferable for the interlayer dielectric film 30 to absorb moisture.

If the first and the second treatments are performed sequentially in the same apparatus, the damaged layer 32 less frequently contacts with moisture in the air. Due to this, the damaged layer 32 is silylated (made hydrophobic) with hardly absorbing moisture. Accordingly, after completion of the semiconductor device, the electric characteristics of the semiconductor device are not adversely influenced by the absorbed moisture.

The third treatment can be performed non-sequentially after the first and the second treatments. At the time of the third treatment, since the sidewall of the interlayer dielectric film 30 is already silylated, it is possible to suppress the sidewall from absorbing moisture. However, needless to say, the third treatment can be performed sequentially with the first and the second treatments. If the third treatment is performed sequentially with the first and the second treatments, time of manufacturing the device in the first embodiment can be reduced.

In the first embodiment, the first and the second treatments are performed using different chemical fluids. Alternatively, the semiconductor substrate can be exposed to a chemical fluid which is a mixture of the chemical fluid used in the first treatment and that used in the second treatment. In this case, it is possible to remove the etching by-products 60 and to make the sidewall of the interlayer dielectric film 30 hydrophobic by performing only one treatment using one chemical fluid. Thereafter, it is preferable to further subject the semiconductor substrate to a heat treatment. It is also preferable that the heat treatment is performed in an atmosphere in which the oxidative matters are almost eliminated.

Second Embodiment

In a second embodiment of the present invention, the etching by-products 60 are removed and the sidewall of the interlayer dielectric film 30 is made hydrophobic by one chemical fluid treatment. Since a method of manufacturing a semiconductor device according to the second embodiment is similar to that shown in FIGS. 1 to 3, diagrammatic representation of the second embodiment is omitted.

In the second embodiment, a chemical fluid including a silylation reagent is used for making the sidewall of the interlayer dielectric film 30 hydrophobic. It is preferred that a mixture fluid (hereinafter, "first mixture fluid") of a silylation reagent, water, and a basic compound (ammonia, organic amine, organic amides or the like) is used as the chemical fluid. It is to be noted that ammonia and copper easily generate a water-soluble complex and copper is dissolved in the first mixture fluid. Due to this, it is preferable that the organic amine ($[R_1R_2R_3R_4N]+OH-$; where R1 to R4 are functional groups) or the organic amide is used as the basic compound if the wiring 20 is made of copper. Examples of the basic compound include tetramethylammonium hydroxide (TMAH), tetraethylammonium hydroxide (TEAH), triethyl-monomethyl-ammonium hydroxide (TEMAH), and choline.

If an oxidation-reduction potential of the first mixture fluid is higher than 0.5 V, a probability of etching the front-end material (copper) is increased. It is, therefore, preferable that the oxidation-reduction potential of the first mixture fluid is equal to or lower than 0.5 V.

To remove the etching by-products, at least one of a carboxylic acid, an amino acid, a salt of the carboxylic acid, and a salt of the amino acid is further mixed into the first mixture fluid. The resultant mixture fluid will be referred to as "second mixture fluid" hereinafter. Examples of the carboxylic acid include citric acid, oxalic acid, acetic acid, maleic acid, fumaric acid, formic acid, benzoic acid, phthalic acid, terephthalic acid, salicylic acid, lactic acid, malic acid, tartaric acid, and propionic acid. Examples of the amino acid include glycine, alanine, serine, cystine, lysine, phenylalanine, tyrosine, and glutamic acid. By exposing the semiconductor substrate to the second mixture fluid, it is possible to remove the etching by-products and to make the sidewall of the interlayer dielectric film 30 hydrophobic by one chemical fluid treatment.

It is to be noted that some of the carboxylic acid, the amino acid, the salt of the carboxylic acid, or the salt of the amino acid and copper generate a complex such as chelate. It is, therefore, preferable to select the organic amine, the carboxylic acid, the amino acid or the like so as to selectively etch a copper compound such as CuOx. It is particularly preferable to select the carboxylic acid that includes only one carboxylic group, or the organic amine, the carboxylic acid, the amino acid, or the like that does not generate or hardly generates, together with Cu, a complex due to steric hindrance so as not to generate the chelate. However, if it is difficult to dissolve CuOx using the chemical fluid having a pH higher than 4, it is preferable to select the organic amine, the carboxylic acid, the amino acid, or the like that generates, together with copper, the complex such as the chelate.

To remove the silicon residue consisting of a silicon compound, HF, NH4F, the fluorine compound of the organic amine or the fluorine compound of the organic amide can be further mixed into the second mixture fluid. The resultant mixture fluid will be referred to as "third mixture fluid" hereinafter. By exposing the semiconductor substrate to the third mixture fluid, it is possible to remove the etching by-products (the copper compound and the silicon compound) and to make the sidewall of the interlayer dielectric film 30 hydrophobic by one chemical fluid treatment.

It is preferable to control a pH of the third mixture fluid by controlling an amount of water and an amount of fluorine compound such as fluorinated acid so as to suppress the damaged layer 32 from being etched. More specifically, it is preferable to make the third mixture fluid a weak acid or alkaline fluid having a pH equal to or higher than 4 by controlling dissociation to $F^-$ ions and generation of $HF_2^-$ ions. By using such chemical fluid thus controlled, it is possible to suppress the etching of $SiO_2$ to prevent the damaged layer 32 from being excessively etched in the third treatment.

If an etchant used in the first treatment does not contain fluorinated acid, the metal residue is removed but the silicon residue sometimes remains without being removed. In this case, if the second treatment is performed after the first treatment, the silicon residue is made hydrophobic. As a result, it is disadvantageously difficult to remove the silicon residue. Furthermore, more silicon residue is disadvantageously generated by the second treatment. By exposing the semiconductor substrate to the third mixture fluid, the removal of the metal residue, the removal of the silicon residue, and the treatment of making the sidewall of the interlayer dielectric film hydrophobic can be performed by one chemical fluid treatment. Therefore, the disadvantages of the first embodiment can be solved.

Preferably, the semiconductor substrate is subjected to a heat treatment after one chemical fluid treatment to further accelerate the silylation of the damaged layer 32. To suppress oxidation of the front-end material (copper), the heat treatment is preferably performed in an atmosphere in which oxidative matters are almost eliminated.

The second embodiment can exhibit the same advantage as that of the first embodiment.

Third Embodiment

In a third embodiment of the present invention, after the first treatment is performed, one treatment is performed to remove the silicon residue and to make the sidewall of the interlayer dielectric film 30 hydrophobic. Since a method of manufacturing a semiconductor device according to the third embodiment is similar to that shown in FIGS. 1 to 3, diagrammatic representation of the third embodiment is omitted. Furthermore, since the first treatment in the third embodiment is the same as that in the first embodiment, it will not be explained herein. If the oxidation-reduction potential of the chemical fluid used in the first treatment is higher than 0.5 V, the probability of etching the front-end material (copper) is increased. It is, therefore, preferable that the oxidation-reduction potential of the chemical fluid used in the first treatment is equal to or lower than 0.5 V.

In the third embodiment, a semiconductor substrate is exposed to a chemical fluid that is a mixture of the silylation reagent and fluorine compounds such as HF or $NH_4F$, a fluorine compound of an organic amine, and a fluorine compound of an organic amide (hereinafter, "fourth mixture fluid") to remove the silicon residue and to make the sidewall of the interlayer dielectric film 30 hydrophobic.

By exposing the semiconductor substrate to the fourth mixture fluid, it is possible to remove the silicon residue and to make the sidewall of the interlayer dielectric film 30 hydrophobic by one chemical fluid treatment.

Moreover, the removal of the silicon residue is performed simultaneously with making the sidewall of the interlayer dielectric film 30 hydrophobic. Thus, the disadvantage of leaving the silicon residue by the etching or the second treatment does not occur.

The etching of the sidewall of the interlayer dielectric film 30 is suppressed due to the silylation of the sidewall. However, it is preferable to control a pH of the fourth mixture fluid by controlling an amount of water and an amount of the fluorine compound such as fluorinated acid so as to suppress the damaged layer 32 from being etched. More specifically, it is preferable to make the fourth mixture fluid a weak-acid or alkaline fluid having a pH equal to or higher than 4 by controlling dissociation to $F^-$ ions and generation of $HF_2^-$ ions. By using such chemical fluid, it is possible to suppress the etching of $SiO_2$ to prevent the damaged layer 32 from being excessively etched in the treatment of removing the silicon residue and making the sidewall of the interlayer dielectric film hydrophobic.

Preferably, the semiconductor substrate is subjected to a heat treatment after the silicon residue is removed and the sidewall of the interlayer dielectric film is made hydrophobic to further accelerate the silylation of the damaged layer 32. To suppress oxidation of the front-end material (copper), the heat treatment is preferably performed in an atmosphere in which oxidative matters are almost eliminated. The third embodiment can exhibit the same advantage as that of the first embodiment.

In the first to the third embodiments, the wiring 20 mainly consisting of copper is used. Alternatively, a metal such as tungsten, titanium, or aluminum or a metal compound can be replaced by copper as the material of the wiring 20. In this case, to form a passivation on a surface of the metal such as titanium or aluminum, an oxidizing agent such as $H_2O_2$, $O_3$, peroxosulfuric acid, nitric acid, nitrate, sulfuric acid, sulfate, chlorous acid, chlorite, hypochlorous acid, or hypochlorite can be added to the chemical fluid.

Figure 7:
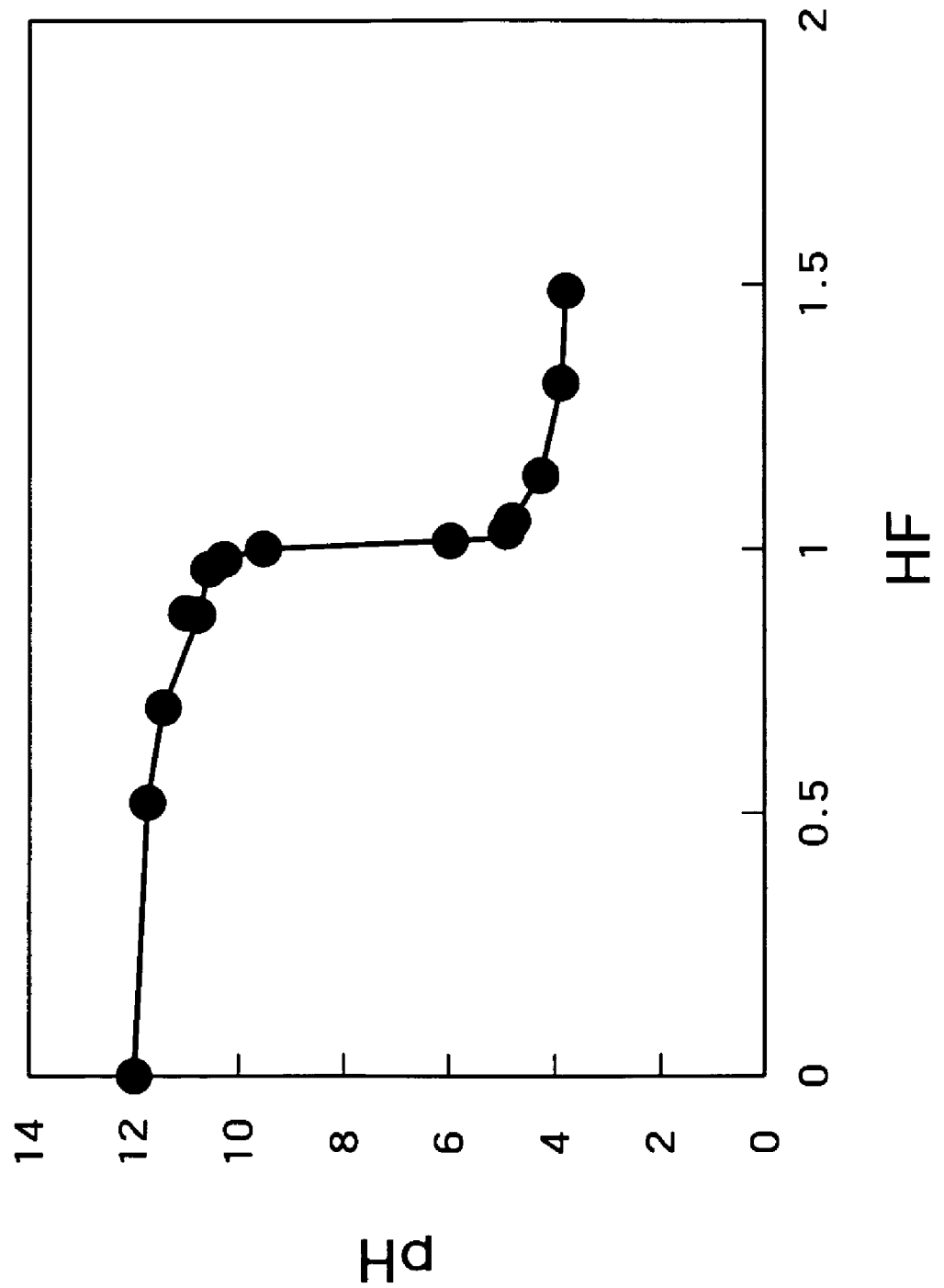
FIG. 7 is a graph showing the relationship between a molar ratio of the fluorinated acid to the organic amine in the chemical fluid used in the first to the third embodiments and the pH of the chemical fluid.

FIG. 7 is a graph showing the relationship between a molar ratio of the fluorinated acid to the organic amine in the chemical fluid used in the first to the third embodiments and the pH of the chemical fluid as an example. If the molar ratio of the fluorinated acid is equal to or higher than 1, an etching rate of etching a silicon oxide film is higher. As a result, not only the silicon residue but also the damaged layer 32 are etched by the chemical fluid. It is, therefore, preferable that the molar ratio of the fluorinated acid is lower than 1. If the molar ratio of the fluorinated acid is lower than 1, the pH of the chemical fluid is equal to or higher than 4, that is, the chemical fluid is a weak-acid or alkaline fluid. It is, therefore, preferable that the pH of the chemical fluid used to remove the etching compounds in the first to the third embodiments is equal to or higher than 4.

The invention claimed is:

1. A method of manufacturing a semiconductor device, comprising:
   providing a dielectric film on a substrate;
   providing a mask material on the dielectric film;
   etching the dielectric film using the mask material;
   performing a first treatment of removing a metal residue generated by etching the dielectric film from a sidewall of the dielectric film without removing the dielectric film;
   performing a second treatment of making a sidewall of the dielectric film formed by etching the dielectric film hydrophobic; and
   performing a third treatment of removing a silicon residue generated by etching the dielectric film, wherein the first treatment is a treatment of exposing the semiconductor substrate to a chemical fluid containing an inorganic acid, an organic acid, a salt of the inorganic acid or a salt of the organic acid, the second treatment is a treatment of exposing the semiconductor substrate to a chemical fluid containing a silylation reagent, and the third treatment is a treatment of exposing the semiconductor substrate to a chemical fluid containing a fluorine compound, wherein an oxidation-reduction potential of the chemical fluid containing the inorganic acid, the organic acid, a salt of the inorganic acid or a salt of the organic acid and used in the first treatment is equal to or lower than 0.5 V.

2. The method of manufacturing a semiconductor device according to claim 1, wherein the first treatment, the second treatment, and the third treatment are performed sequentially.

3. The method of manufacturing a semiconductor device according to claim 1, wherein a heat treatment is performed after the second treatment so as to accelerate hydrophobicity.

4. A method of manufacturing a semiconductor device comprising:

providing a dielectric film on a substrate;

providing a mask material on the dielectric film;

etching the dielectric film using the mask material;

performing a first treatment of removing a metal residue generated by etching the dielectric film from a sidewall of the dielectric film without removing the dielectric film;

performing a second treatment of making a sidewall of the dielectric film formed by etching the dielectric film hydrophobic; and performing a third treatment of removing a silicon residue generated by etching the dielectric film, wherein the first treatment is a treatment of exposing the semiconductor substrate to a chemical fluid containing an inorganic acid, an organic acid, a salt of the inorganic acid or a salt of the organic acid, the second treatment is a treatment of exposing the semiconductor substrate to a chemical fluid containing a silylation reagent, and the third treatment is a treatment of exposing the semiconductor substrate to a chemical fluid containing a fluorine compound, wherein the chemical fluid containing the fluorine compound and used in the third treatment is a weak-acid or alkaline fluid having a pH equal to or higher than 4.

5. The method of manufacturing a semiconductor device according to claim 4, wherein the first treatment, the second treatment, and the third treatment are performed sequentially.

6. The method of manufacturing a semiconductor device according to claim 4, wherein a heat treatment is performed after the second treatment so as to accelerate hydrophobicity.

* * * * *